United States Patent [19]
Ogisu et al.

[11] Patent Number: 5,837,354
[45] Date of Patent: Nov. 17, 1998

[54] FLEXIBLE METALLIZED PRODUCTS AND PROCESS FOR PRODUCING THE SAME

[75] Inventors: Yasuhiko Ogisu, Nagoya; Yukitaka Hasegawa, Anjyo, both of Japan

[73] Assignee: Toyoda Gosei Co., Ltd., Aichi-ken, Japan

[21] Appl. No.: 673,000

[22] Filed: Jul. 1, 1996

[30]    Foreign Application Priority Data

Jun. 30, 1995  [JP]  Japan .................................. 7-166378
Oct. 4, 1995   [JP]  Japan .................................. 7-257690

[51] Int. Cl.⁶ .......................... B32B 15/06; B32B 15/08; B32B 25/16; B32B 27/32
[52] U.S. Cl. ...................... 428/208; 428/195; 428/201; 428/203; 428/209; 428/461; 428/462; 427/525; 427/526; 427/531; 427/532; 427/585; 427/250; 427/296; 427/404; 204/192.1
[58] Field of Search ................... 428/195, 201, 428/203, 204, 206, 208, 209, 457, 461, 462; 427/523, 525, 531, 585, 404, 526, 532, 250, 296, 332; 204/192.12, 192.14, 192.1

[56]           References Cited

U.S. PATENT DOCUMENTS

| 4,183,975 | 1/1980 | Sidders ................................... 427/50 |
| 4,211,822 | 7/1980 | Kurfman et al. .................... 428/412 |
| 4,241,129 | 12/1980 | Marton et al. ........................ 428/216 |
| 4,268,570 | 5/1981 | Imanaka et al. ..................... 428/216 |
| 4,369,225 | 1/1983 | Manabe .................................. 428/334 |
| 4,407,871 | 10/1983 | Eisfeller .................................. 428/31 |
| 4,431,711 | 2/1984 | Eisfeller .................................. 428/31 |
| 5,021,298 | 6/1991 | Revell ................................... 428/458 |
| 5,283,118 | 2/1994 | Murakami et al. ................... 428/349 |

FOREIGN PATENT DOCUMENTS

| 0 010 971 | 5/1980 | European Pat. Off. . |
| 59-40105 | 9/1984 | Japan . |
| 61-21146 | 5/1986 | Japan . |
| 2 022 461 | 12/1979 | United Kingdom . |

OTHER PUBLICATIONS

Patent Abstracts of Japan, vol. 009, No. 138 (C–286) Jun. 1985 re: JP–A–60 024368.
European Abstract, Publication No. 92–155483; Mar. 1992.

*Primary Examiner*—Vivian Chen
*Attorney, Agent, or Firm*—Cushman Darby & Cushman IP Group of Pillsbury Madison & Sutro LLP

[57]           ABSTRACT

A flexible metallized product having a base material made of a soft resin material comprising polypropylene mixed with diene or polypropylene mixed with rubber, a base coat layer formed on the surface of the base material, a metal thin film layer formed on the surface of the base coat layer and a top coat layer covering the metal thin film layer. The metal thin film layer is made of a corrosion resistant metal such as chromium. The metal thin film layer has a thickness of at least 150 Å and no greater than 800 Å by means of a vacuum vapor deposition or sputtering. The metal thin film layer is constituted by a plurality of metal particles. The metal particles are disposed such that adjacent metal particles are in contact with one another to form a grain boundary therebetween.

6 Claims, 4 Drawing Sheets

FLEXIBLE METALLIZED PRODUCTS AND PROCESS FOR PRODUCING THE SAME

BACKGROUND OF THE INVENTION

1. Field of the Invention

The present invention relates to a flexible metallized product used, for example, as an automotive front grille and to a process for producing the same. More particularly, the present invention relates to a flexible metallized product, the surface of which has a metallic luster, and to a process for producing the same.

2. Description of the Related Art

Generally, a flexible metallized product 51 consists of a base material 52 made of, for example, polyurethane, a base coat layer 53 formed by applying a coating on the base material 52, a metal thin film layer 54 formed on the base coat layer 53 and a top coat layer 55 formed by applying a coating on the metal thin film layer 54, as shown in FIG. 8. The base coat layer 53 provides the base material 52 with a mirror smooth surface on which the metal thin film layer 54 is to be formed, as well as enhances adhesion of the metal thin film layer 54. The top coat layer 55 is formed mainly for protecting the metal thin film layer 54.

Because the metal thin film layer 54 has a continuous film structure in the flexible metallized product 51 shown in FIG. 8, the following problem is likely to arise. When the flexible metallized product 51 is subjected to stress, as shown by arrows 57 in FIG. 9, it distorts, yields to the stress, and absorbs it. Of the constituents of the flexible metallized product 51, the base material 52, the base coat layer 53 and the top coat layer 55, even when subjected to stress, are distorted by the stress and recover their original shapes after the stress is removed. However, the metal thin film layer 54 cannot be distorted like the other constituents and may develop cracks 56, as shown in FIG. 9. Such cracking can be seen as white streaks, and thus, the appearance of the product 51 is significantly deteriorated.

Japanese Patent Publication No. Sho 59-40105 (referred to herein as the '105 reference) discloses a technique which can solve the above-described problem. According to this reference, a metal thin film layer of nickel-chromium type alloy is formed on the base coat layer, for example, by means of sputtering. This metal thin film layer is a continuous film and has a thickness of about 150 Å to 500 Å. According to the '105 reference, because the metal thin film layer has a predetermined malleability and a predetermined ductility, it can be distorted when subjected to some degree of flexure stress and yields to that stress. Thus, the metal thin film layer is prevented from cracking.

Another technique is also disclosed in Japanese Patent Publication No. Sho 61-21146 (referred to herein as the '146 reference). According to this reference, a thin layer of finely divided metal particles having no corrosion resistance, such as of indium, is formed on the base coating by means of vacuum vapor deposition. In the thus formed thin layer, adjacent metal particles are not in contact with one another. Accordingly, when the product is subjected to flexure stress, the gaps between the metal particles are merely widened and cracking does not occur. Furthermore, because the metal particles are not in contact with one another, propagation of corrosion is controlled. Therefore, even if corrosion occurs at some part of the thin layer, such corrosion is prevented from propagating throughout the thin layer.

However, the '105 reference and the '146 reference have the following disadvantages. Referring to the '105 reference, although the metal thin film layer is distorted when subjected to some degree of flexure stress and it yields to that stress, the degree of distortion is limited because the metal thin film layer is a single continuous film. In other words, the metal thin film layer cracks if it is bent to assume a radius of curvature smaller than a predetermined degree. As a result, such cracking is seen as white streaks to significantly deteriorate the appearance of the product.

Referring to the '146 reference, only a very few metals, such as indium, can form thin layers of finely divided metal particles. However, indium is not corrosion resistant. Accordingly, if the thin layer is formed of indium, corrosion readily occurs, even if the metal particles constituting the thin layer are not in contact with one another. Therefore, there still remains a problem with corrosion resistance.

Further, in the '146 reference, because gaps are formed between the metal particles constituting the thin layer, the base coat layer and the top coat layer are partially adhered directly to each other. Therefore, if the adhesion strength between the base coat layer and the top coat layer and weather resistance are not taken into account in forming products, the top coat layer may separate upon direct exposure to sunlight where the base coat layer and the top coat layer contact each other.

SUMMARY OF THE INVENTION

It is an objective of the present invention to provide a flexible metallized product having excellent corrosion resistance and weather resistance, which can securely prevent the metal thin film layer from undergoing cracking even when the product is distorted.

To achieve the above object, the flexible metallized product according to the present invention comprises a base material made of a soft resin material, a base coat layer formed on the surface of the base material, a metal thin film layer formed on the surface of the base coat layer and a top coat layer provided for covering the metal thin film layer. The metal thin film layer is made of a metal having corrosion resistance. The metal thin film layer is formed to have a thickness of greater than or equal to 150 Å and less than or equal to 800 Å. The metal thin film layer is constituted by a plurality of metal particles. The metal particles are disposed such that adjacent metal particles are in contact with one another to form grain boundary therebetween, thereby providing a sufficient degree of flexibility without cracking, while being relatively corrosion resistant.

Other objects, features and characteristics of the present invention, as well as methods of producing same and functions of related elements of structure, and the combination of prior art and economies of manufacture will become apparent upon consideration of the following description and the appended claims with reference to the accompanying drawings, all of which form a part of this application.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments taken in conjunction with the accompanying drawings in which:

DETAILED DESCRIPTION OF THE PREFERRED EMBODIMENTS

First Embodiment

A first embodiment of the flexible metallized product according to the present invention embodied in an automotive front grille will be described below referring to FIGS. 1 through 5.

Figure 1:
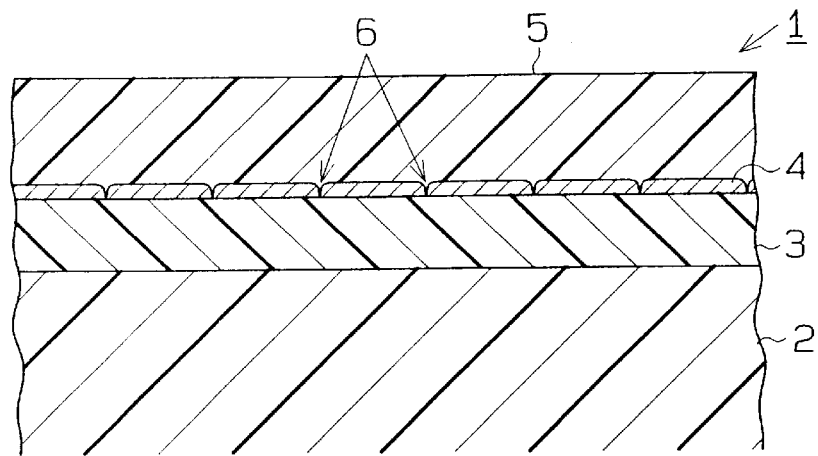
FIG. 1 schematically shows an enlarged partial cross-sectional view of a front vehicle grille according to a first embodiment of the present invention.
Figure 2:
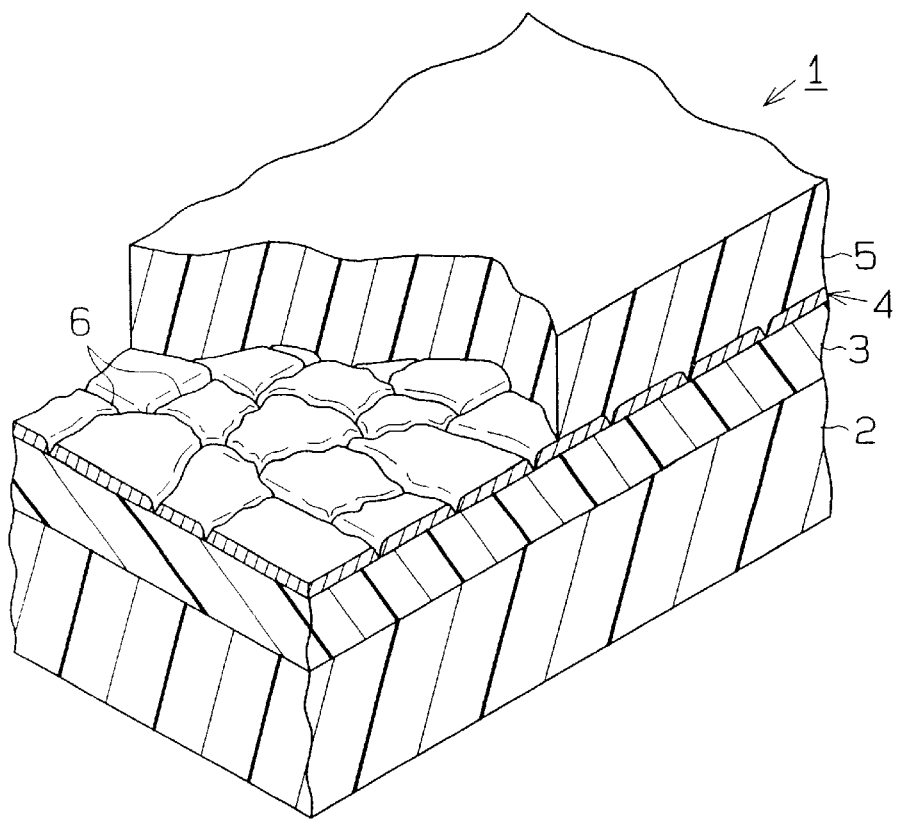
FIG. 2 schematically shows a partly cut-away perspective view of the front grille.

As shown in FIGS. 1 and 2, a grille 1 as a flexible metallized product consists of a base material 2, a base coat layer 3 formed by applying a coating on the base material 2, a metal thin film layer 4 formed on the base coat layer 3 and a top coat layer 5 formed by applying a coating on the metal thin film layer 4. The base material 2 is a soft resin material molded by the known injection molding method using a polypropylene material admixed with a rubber-like component. Ethylene-propylene rubbers can be suitably employed as the rubber-like component. As the polypropylene, one available from Mitsubishi Chemical Corporation under the trade name of FG5 can be suitably employed. The polypropylene may include diene polymers, such as polyhydroxybutadiene, that have polar groups including hydroxyl groups. Inclusion of the rubber-like component can achieve not only flexibilization of the base material 2 but also introduces OH groups and the like as adhesive moieties onto the surface of the base material to increase adhesion strength against the base coat layer 3.

The coating for forming the base coat layer is a mixture of an acrylic urethane coating and chlorinated polypropylene. After this coating is applied onto the base material 2, the resulting coating layer is baked at a temperature of 80° C. for 60 minutes to form a base coat layer 3. As the acrylic urethane coating, one available from NBC Kabushiki-Kaisha under the trade name or KA3ZQ can be suitably employed.

The coating for forming the top coat layer 5 is a urethane coating. As such coating, one available from NBC Kabushiki-Kaisha under the trade name of KX-242-2 can be suitably employed. After this coating is applied onto the metal thin film layer 4, the resulting coating layer is baked lt a temperature of 80° C. for 60 minutes to form a top coat layer 5. The top coat layer 5 protects the metal thin film layer 4.

The metal thin film layer 4 having a metallic luster is, for example, chromium having a purity of 99.99% manufactured by Kojyundo-Kagaku Kabushiki-Kaisha. The metal thin film layer 4 is formed to have a thickness of about 400 Å.

The metal thin film layer 4 according to this embodiment can seen macroscopically as a metal film. However, this metal thin film layer 4 microscopically has a configuration in which finely divided metal particles are disposed such that adjacent metal particles are in contact with one another. In other words, the metal thin film layer 4 is formed by disposing a multiplicity of metal particles on the base coat layer 3 so that the boundary between every adjacent two metal particles constitutes a so-called grain boundary 6.

Figure 3:
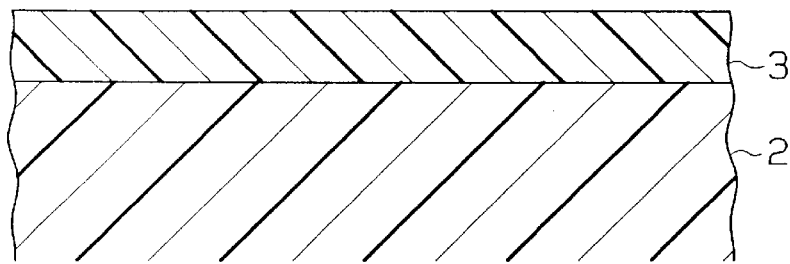
FIG. 3 shows a partial cross-sectional view for explaining a process for producing the front grille.

Next, a process for producing the thus constituted front grille 1 will be described. First, as shown in FIG. 3, a base material 2 having the shape of the front grille 1 is molded by means of a known injection molding method. Subsequently, the surface of the base material 2 is degreased with isopropyl alcohol or the like and then air-dried. Next, the coating for forming base coat layer 3 is applied on the surface of the base material 2 to a thickness of about 15 μm and then baked at a high temperature of 80° C. for 60 minutes. Thus, a base coat layer 3 is formed on the surface of the base material 2.

Figure 4:
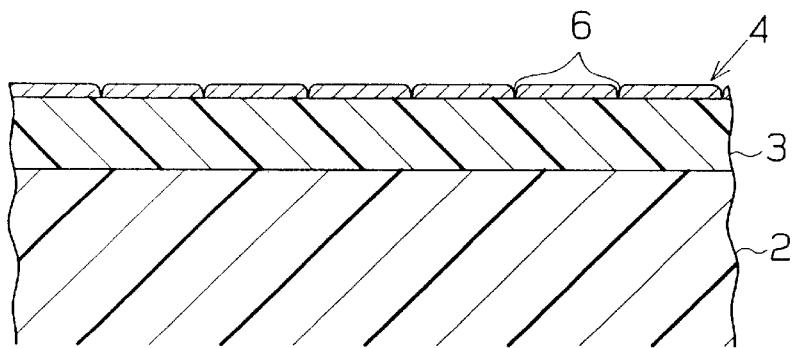
FIG. 4 also shows a partial cross-sectional view for explaining the process for producing the front grille.
Figure 5:
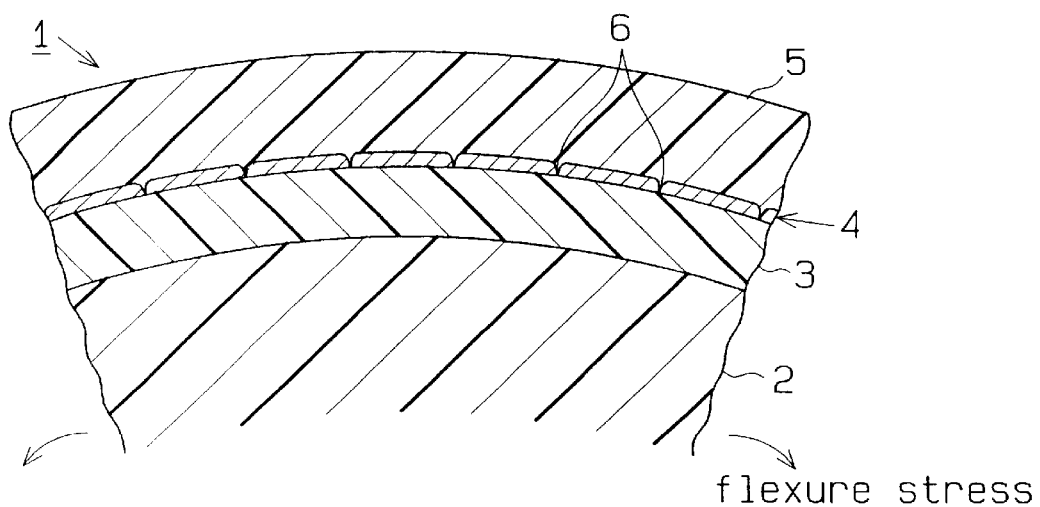
FIG. 5 shows an enlarged cross-sectional view for explaining actions of the first embodiment.

Subsequently, the base material having the base coat layer 3 formed thereon is set in a known vacuum evaporator, and chromium vapor deposition is started at the time when the initial degree of vacuum in terms of argon gas pressure reaches $2.0 \times 10^{-3}$ Pa. The rate of vacuum vapor deposition is preferably, 1.0 Å/sec. Thus, as shown in FIG. 4, a metal thin film layer 4 containing crystal grain boundaries 6 is formed on the base coat layer 3. The average size of the crystal grains in the metal thin film layer 4 is 200 Å.

Next, the coating forming the top coat layer 5 is applied to the metal thin film layer 4 to a thickness of about 25 μm and then baked at a high temperature of 80° C. for 60 minutes. Thus, a top coat layer 5 is formed on the metal thin film Layer 4. After completion of the baking, the resulting product is left to stand at room temperature for 24 hours to give a front grille 1 described above.

In the thus constituted front grille 1, the flexible resin base material 2, the base coat layer 3 and the top coat layer 5 are distorted when subjected to external stress and yield to the stress. Meanwhile, the metal thin film layer 4 contains crystal grain boundaries 6 so that, even if the metal thin film layer 4 is subjected to stress, the gaps between the adjacent crystal grains are merely widened or the adjacent crystal grains slide, and the metal per se constituting the metal thin film layer 4 is not substantially subjected to the stress. Accordingly, no cracking occurs in the metal thin film layer 4. Therefore, the appearance of the front grille 1 does not deteriorate easily.

The present inventors, with a view to confirming the above-described effect, repeated ten times procedures of bending the front grille 1 about a round rod having a diameter of 25 mm by 90° with the top coat layer 5 facing outward and visually evaluated the appearance of the front grille 1. The result of this bending test, they found no defect in the front grille 1 according to this embodiment.

The metal thin film layer 4 microscopically consists of finely divided metal particles. However, the metal thin film Layer 4, which is an aggregate of finely divided metal articles, is seen macroscopically as a planar single metal film. In other words, the metal thin film layer 4 appears to be an ordinary metal film. Accordingly, the front grille 1 of this embodiment is not inferior in appearance to one having a metal thin film in the form of continuous single film. The metal thin film layer 4 according to this embodiment proved to have a visible light reflectance of 55%.

Since the metal thin film layer 4 is of corrosion-resistant chromium, it hardly corrodes. Particularly, because the metal thin film layer 4 contains crystal grain boundaries 6, it has poor conductivity between adjacent crystal grains. Accordingly, even if corrosion occurs at some part of the metal thin film layer 4, the corrosion resists propagating. The metal thin film layer 4 according to this embodiment has a surface resistance of 250 k$\Omega$/□. The unit of resistance "k$\Omega$/□" refers to the electrical resistance between two confronting sides of a square of a given size. This resistance is invariable regardless of the size of the square.

The material for forming the top coat layer 5 does not penetrate through the crystal grain boundaries 6 of the metal thin film layer 4. Accordingly, there exists no portion where the base coat layer 3 and the top coat layer 5 directly adhere to each other, at least where the metal thin film layer 4 exists. Therefore, there is no reduction in the adhesion strength between the base coat layer 3 and the top coat layer 5, and even if the front grille 1 is exposed to sunlight, separation of the top coat layer 5 does not occur, thus improving weather resistance.

The present inventors made the following accelerated weathering test so as to confirm the above-described effect. In this test, after the front grille 1 was left to stand in a Sunshine Weather-O-Meter for 1,000 hours, the appearance of the thus treated front grille 1 was visually evaluated, and adhesion of the top coat layer 5 was also evaluated. As the result of this test, there was observed no abnormality in the appearance and adhesion in the front grille 1 according to this embodiment.

The base material 2 is made of a polypropylene material. Accordingly, the cost of the product is notably reduced in this embodiment compared with the case where the base material is made of polyurethane.

The base coat layer 3 is formed on the surface of the base material 2. The base coat layer 3 has a mirror smooth surface without subjecting the surface of the base material 2 to an extra mirror finishing treatment, thus improving appearance of the front grille 1 without increasing production time and costs.

Where the metal thin film layer was formed according to the method corresponding to the first '105 reference described above, or when a continuous film of nickel-chromium alloy was formed, cracks were formed in the metal thin film layer when the resulting front grille was subjected to the same bending test as described above, and the appearance of the front grille was significantly deteriorated. This metal thin film layer had a very low surface resistance of 0.01 k$\Omega$/□, which suggests that the metal thin film layer 54 constitutes a continuous film. Accordingly, if corrosion occurs at some part of the metal thin film layer, the corrosion will propagate readily.

In the case where the thin layer was formed according to the method corresponding to the '146 reference, or when a thin layer composed of insular metal crystal grains was formed by means of indium vapor deposition, no significant abnormality was observed as a result of the bending test. However, when the resulting front grille was subjected to the same accelerated weathering resistance test as described above, separation of the top coat layer from the base coat layer occurred, and the product showed a whitened appearance. This thin layer had a very high surface resistance of 100,000 k$\Omega$/□, which suggests that the gaps between the crystal grains are great. Accordingly, adhesion between the base coat layer and the top coat layer occurs, which results in separation and whitening.

The first embodiment described above can be modified in the following manner. In the first embodiment, when the metal thin film layer 4 is being formed, the base material 2 having the base coat layer 3 is maintained at a normal temperature (generally 15° to 25° C.). In such a modification, the metal thin film layer 4 is formed with the base material 2 having the base coat layer 3 formed thereon heated above the normal temperature. Specifically, when the base material 2 having the base coat layer 3 formed thereon is set in a vacuum evaporator, the internal temperature of the evaporator is elevated to 80° C., and thus, the base coat layer 3 and the base material 2 are heated to 80° C. Chromium deposition is carried out in this state.

According to this modification, the surface energy of the base coat layer 3 is increased by the heating, and thus, positional arbitrariness of other substances to be adhered to that surface are enhanced. Therefore, when the metal for forming the metal thin film layer 4 deposits on the base coat layer 3, it settles at positions where it can most stably adhere to the base coat layer 3. As a result, adhesion between the base coat layer 3 and the metal thin film layer 4 is further enhanced. Furthermore, because the surface energy of the metal is enhanced during formation of the metal thin film layer 4, metal film forming the metal thin film layer grows stably. Accordingly, the inner stress of the metal thin film layer 4 is relieved, thus further suppressing cracks from occurring therein.

When the metal thin film layer 4 is being formed, the heated base coat layer 3 and the base material 2 are somewhat expanded. While a coating for forming the top coat layer 5 is applied after formation of the metal thin film layer 4, the coating is applied after the base material 2 having the base coat layer 3 and the metal thin film layer 4 formed thereon is cooled to the normal temperature. The expanded base material 2, base coat layer 3 and metal thin film layer 4 shrink as they are cooled to the normal temperature. This shrinkage increases the density per unit area of the metal constituting the metal thin film layer 4 to provide crystal grain boundaries 6 wherein adjacent particles contact one another. This ensures that the solvent contained in the coating for forming the top coat layer 5, when applied onto the metal thin film layer 4, does not penetrate through the crystal grain boundaries 6. Consequently, adhesion of the base coat layer 3 against the metal thin film layer 4 is not reduced. Therefore, separation of the metal thin film layer 4 and deterioration of the appearance of the front grille 1 are prevented.

With respect to the metal thin film layer 2 formed according to this modification, the film thickness, average crystal grain size, surface resistance and visible light reflectance are the same as in the first embodiment. Further, when the bending test and the accelerated weathering test were carried out in the same manner as described above with respect to the first embodiment, no abnormality was observed in the front grille 1 obtained according to this modification.

Second Embodiment

Next, a front grille according to a second embodiment of the present invention will be described referring FIGS. 6 and 7. The constituents in this embodiment that are similar to those in the first embodiment have the same reference numbers, and a detailed description thereof is omitted. Differences from the first embodiment will be mainly described below.

Figure 6:
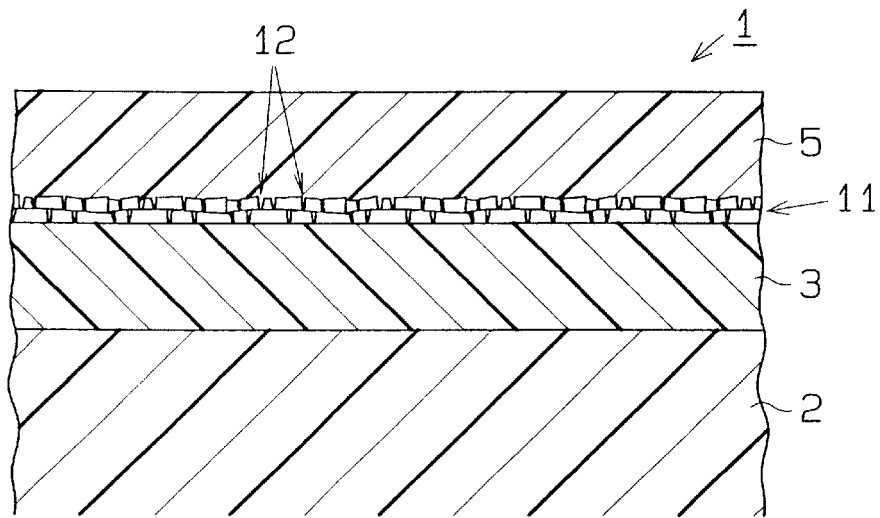
FIG. 6 schematically snows an enlarged partial cross-sectional view of a front grille according to a second embodiment of the present invention.
Figure 7:
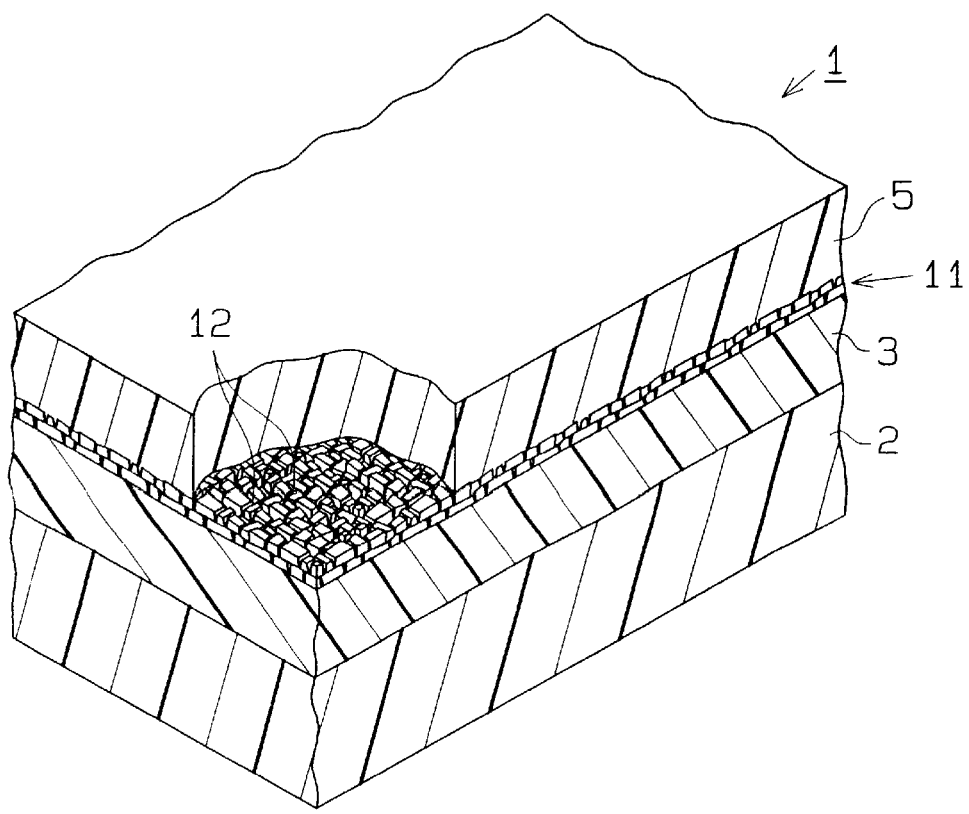
FIG. 7 schematically shows a partly cut-away perspective view of the front grille.
Figure 8:
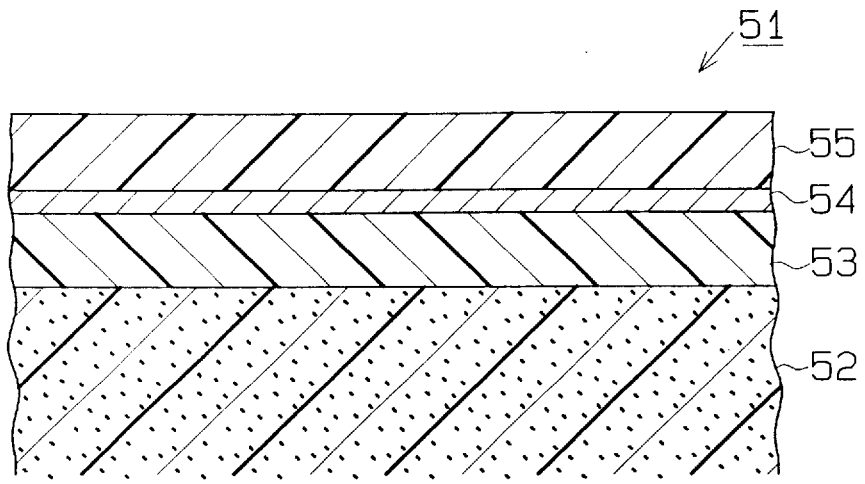
FIG. 8 schematically shows a partial cross-sectional view of the structure of a prior art flexible metallized product.
Figure 9:
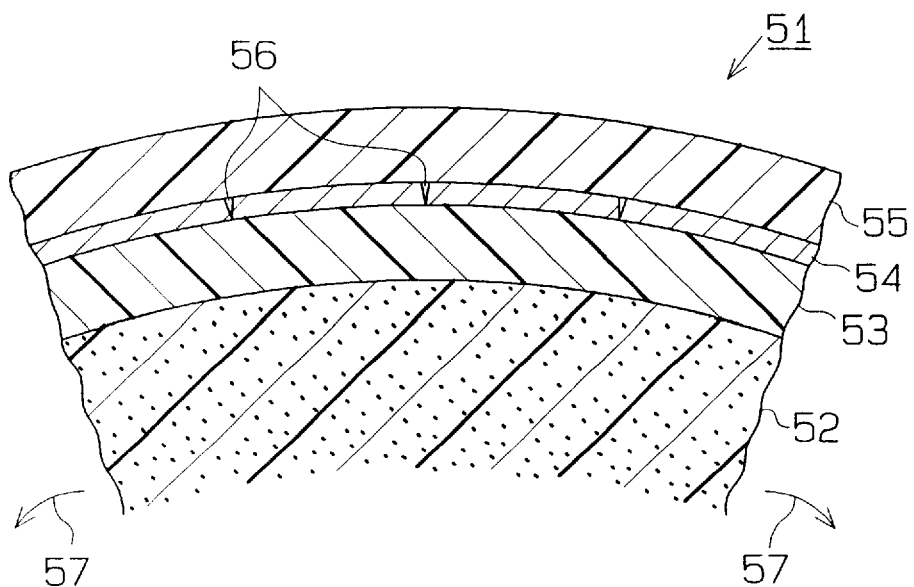
FIG. 9 shows a partial cross-sectional view illustrating the prior art product of FIG. 8 when flexed.

As shown in FIGS. 6 and 7, the method of forming a metal thin film layer 11 in this embodiment is different from that in the first embodiment. More specifically, in this embodiment, the chromium metal thin film layer 11 is formed by means of sputtering.

In this embodiment, the metal thin film layer 11 macroscopically appears as a metal film, as in the first embodiment. The metal thin film layer 11 has a microscopic configuration in which finely divided metal particles are disposed such that adjacent particles are in contact with one another, and the boundary between every adjacent two metal particles constitutes a so-called grain boundary 12. In this embodiment, the size of the metal particles constituting the metal thin film layer 11 is smaller than that in the first embodiment.

The front grille 1 of this embodiment is produced, for example, in the following manner. First, the base material 2 is molded in the same manner as in the first embodiment. Next, a coating for forming the base coat layer 3 is applied on the surface of the base material 2 to a thickness of about 25 μm and then baked at a high temperature of 100° C. for 60 minutes. Thus, a base coat layer 3 is formed on the surface of the base material 2. In this embodiment, an acrylic urethane coating is employed as the coating for forming the base coat layer 3. As the acrylic urethane coating, one available from Fujikura Kasei Co., Ltd. under the trade name of PB2233 can be suitably employed.

Subsequently, the base material 2 having the base coat layer 3 formed thereon is set in a known sputtering apparatus and subjected to chromium sputtering under an initial vacuum degree of $6.0 \times 10^{-3}$ Pa and then under a film-forming vacuum degree of $2.0 \times 10^{-1}$ Pa. This sputtering treatment is carried out at a voltage of 550 V and at a current of 1.0 A for two minutes. Thus, as shown in FIGS. 6 and 7, a metal thin film layer 11 containing crystal grain boundaries 12 is formed on the base coat layer 3.

The thus formed metal thin film layer 11 has a thickness of about 400 Å and an average crystal grain size of 100 Å or Less. In addition, this metal thin film layer 11 had a visible light reflectance of 55% and a surface resistance of about 10 kΩ/□.

Next, a coating for forming the top coat layer 5 is applied onto the metal thin film layer 11 to a thickness of about 25 μm and then baked at a high temperature of 70° C. for 60 minutes. Thus, a top coat layer 5 is formed on the metal thin film layer 11. In this embodiment, an acrylic urethane coating is employed as the coating for forming the top coat layer 5. As the acrylic urethane coating, one available from Fujikura Kasei Co., Ltd. under the trade name of PT2234 can be suitably employed. After completion of the baking, the product is left to stand at room temperature for 24 hours resulting in a front grille 1 described above.

The thus constituted front grille 1 basically exhibits the same advantages and effects as in the first embodiment. When the front grille 1 obtained according to this embodiment was subjected to the same bending test and accelerated weathering resistance test described with respect to the first embodiment, no abnormality was observed.

The metal thin film layer 11 is formed by sputtering in this embodiment. Accordingly, the kinetic energy of metal articles during forming the metal thin film layer 11 is greater than that in the first embodiment where the metal thin film layer is formed by vacuum vapor deposition. Consequently, adhesion of the metal thin film layer 11 against the base coat layer 3 is increased. Furthermore, since the size of the crystal grains becomes more fine, the freedom of the deformation of the metal thin film layer 11 increases, thus further suppressing cracks from occurring therein.

This embodiment can be modified as described below. In the second embodiment just described, which uses sputtering, when the metal thin film layer 11 is being formed, the base material 2 having the base coat layer 3 formed thereon is maintained at a normal temperature (generally 15° to 25° C.). In a modification, the metal thin film layer 11 is formed with the base material 2 having the base coat layer 3 formed thereon being heated above the normal temperature like in the modification of the first embodiment.

Specifically, when the base material 2 having the base coat layer 3 formed thereon is set in a sputtering apparatus, the internal temperature of the apparatus is elevated to 70° C., and thus the base coat layer 3 and the base material 2 are heated to 70° C. Chromium sputtering is carried out in this state.

This sputtering treatment is carried out under an initial vacuum degree of $6.0 \times 10^{-3}$ Pa, under a film-forming vacuum degree of $1.0 \times 10^{-1}$ Pa, at a voltage of 550 V and at a current of 1.0 A for three minutes. The thus formed metal thin film layer 11 has a thickness of about 600 Å, an average crystal grain size of 100 Å or less, a visible light reflectance of 60% and a surface resistance of about 5 kΩ/□. When the front grille 1 so obtained was subjected to the same bending test and accelerated weathering resistance test as described with respect to the first embodiment, no abnormality was observed in the front grille 1.

Particularly, the front grille 1 obtained according to this modification exhibits the advantages and effects equivalent to those in the modification of the first embodiment in addition to those of the second embodiment.

The sputtering conditions may be changed, for example, as follows. For example, the chromium sputtering may be carried out with the internal temperature of the sputtering apparatus being set to 90° C. so as to heat the base coat layer 3 and the base material 2 to 90° C. This sputtering treatment is carried out under an initial vacuum degree of $6.0 \times 10^{-3}$ Pa, under a film-forming vacuum degree of $5.0 \times 10^{-1}$ Pa, at a voltage of 550 V and at a current of 1.5 A for 3.5 minutes. The thus formed metal thin film layer 11 has a thickness of about 800 Å, an average crystal grain size of 100 Å or less, a visible light reflectance of 65% and a surface resistance of about 4 kΩ/□. When the front grille 1 having the metal thin film layer 11 formed thereon was subjected to the same bending test and accelerated weathering resistance test as described previously, no abnormality was observed.

It is to be understood that the present invention is not limited to the foregoing embodiments, but may be constituted, as discussed in the following exemplary modifications.

(1) The thickness of the metal thin film layers 4,11 may be suitably changed within the range of 150 to 800 Å in the respective embodiments. If the metal thin film layers 4,11 have a thickness of less than 150 Å, they may fail to show metallic luster; whereas if they have a thickness of more than 800 Å, it will be difficult to form crystal grain boundaries, and continuous films containing no crystal grain boundary are liable to be formed.

(2) While the metal thin film layers 4,11 are formed of chromium in the foregoing embodiments, these metal layers 4,11 may be formed employing other metallic materials having corrosion resistance. Some corrosion-resistant metallic materials suitable for use in the present invention are, for example, titanium and tantalum and corrosion resistant alloys of titanium and tantalum, as well as alloys of chromium.

(3) While the metal thin film layers 4,11 containing crystal grain boundaries 6,12 are formed by means of vacuum vapor deposition or sputtering in the foregoing embodiments, they may be formed by other means such as ion plating.

(4) While the flexible metallized product is embodied in an automotive front grille 1 in any of the foregoing embodiments, it may be embodied in other products including exterior equipment, such as automotive emblems and side moldings, as well as various kinds of interior equipment;

(5) While the color tone of the base material is not specified in any of the foregoing embodiments, the base material 2 may be colored. A coloring material employable for coloring the base material 2 is, for example, Color No. 101B Gray. The base coat layer 3 may be colored in place of the base material 2.

(6) While the base material 2 having a base coat layer 3 formed thereon may be heated to 80°, 70° or 90° C. in any of the foregoing embodiments, the heating temperature is not critical as long as the base material 2 and the base coat layer 3 are expanded compared with the state assumed under the normal temperature and no significant stress deformation is caused. The heating temperature is preferably 40° C. or higher. In order to obtain the above-described advantages and effects, the heating temperature is more preferably 60° C. or higher, and still more preferably 70° C. or higher. Although it depends on the kinds of materials used, the heating temperature is desirably 100° C. or lower when the materials specified in the foregoing embodiments are to be employed.

(7) The thickness of the base coat layer 3 may and top coat layer 5 may be suitably changed within the range of 10 $\mu$m to 40 $\mu$m in the respective embodiments. In addition, when forming the base coat layer 3 may and top coat layer 5, the baking temperature and baking time may be appropriately determined so that the coating material can be completely hardened.

(8) The conditions for vacuum vapor deposition of chromium may be suitably changed in the first embodiment. For example, the rate of vacuum vapor deposition of chromium may be changed within the range of 0.5 to 2.0 Å/sec. Furthermore, the initial degree of the vacuum may be changed within the range of $9.0 \times 10^{-4}$ Pa to $4.0 \times 10^{-3}$ Pa.

(9) The conditions for sputtering of chromium may be suitably changed in the second embodiment. For example, the rate of sputtering of chromium may be changed with the range of 1.0 to 6.0 Å/sec. Furthermore, the film-forming vacuum degree may be changed within the range of $1.0 \times 10^{-2}$ Pa to 1.0 Pa.

Therefore, the present examples and embodiments are to be considered as illustrative and not restrictive, and the invention is not to be limited to the details given herein, but may be modified within the scope of the appended claims.

What is claimed is:

1. A flexible metallized product comprising:
   a base material made from a resin selected from the group consisting of a polypropylene material mixed with a diene polymer having hydroxyl groups and a polypropylene material mixed with a rubber component;
   a base coat layer disposed on at least part of a surface of said base material;
   a metal thin film layer disposed on at least part of said surface of said base coat layer, said metal thin film layer being defined by a corrosion resistant metal having a thickness of at least 150 Å and not greater than 800 Å, and wherein said metal thin film layer is constituted by a plurality of individual metal particles of said metal disposed such that adjacent metal particles are in contact with one another so as to form a grain boundary therebetween; and
   a top coat layer disposed on at least said metal thin film layer.

2. A product according to claim 1, wherein said metal thin film layer is chromium.

3. A method for producing a flexible metallized product, the method comprising the steps of:
   providing a base material made from a resin selected from the group consisting of a polypropylene material mixed with a diene polymer having hydroxyl groups and a polypropylene material mixed with a rubber component;
   forming a base coat layer on at least part of a surface of said base material by applying a first coating to said base material;
   forming a metal thin film layer on at least part of said surface of said base coat layer, said metal thin film layer being defined by a corrosion resistant metal having and having a thickness of at least 150 Å and no greater than 800 Å and wherein said metal thin film layer is constituted by a plurality of metal particles disposed such that adjacent metal particles are in contact with one another so as to form grain boundary therebetween, said metal thin film layer being formed in a state where said base material is heated above a normal temperature; and
   forming a top coat layer so as to cover at least said metal thin film layer by applying a second coating to said metal thin film layer.

4. A method according to claim 3, wherein said base material on which said base coat layer is formed is heated to a temperature above 60° C. during formation of said metal thin film layer.

5. A method according to claim 4, wherein said thin film layer is formed by means of a method selected from the group consisting of vacuum vapor deposition, sputtering and ion plating.

6. A method according to claim 5, wherein said metal thin film layer is formed of chromium.

* * * * *